(12) United States Patent
Hikita et al.

(10) Patent No.: US 6,462,420 B2
(45) Date of Patent: *Oct. 8, 2002

(54) SEMICONDUCTOR CHIP AND SEMICONDUCTOR DEVICE HAVING A CHIP-ON-CHIP STRUCTURE

(75) Inventors: Junichi Hikita; Hiroo Mochida; Goro Nakatani; Kazutaka Shibata, all of Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/502,433

(22) Filed: Feb. 11, 2000

(65) Prior Publication Data

US 2002/0056899 A1 May 16, 2002

(30) Foreign Application Priority Data

Feb. 12, 1999 (JP) ............................................ 11-034521

(51) Int. Cl.$^7$ ............................................... H01L 23/48
(52) U.S. Cl. ....................................... 257/777; 257/786
(58) Field of Search ................................. 257/777, 737, 257/723, 786; 438/613, 108; 228/180.2

(56) References Cited

U.S. PATENT DOCUMENTS

| 4,865,245 A | * | 9/1989 | Schulkte et al. ............. 228/116 |
| 4,878,611 A | * | 11/1989 | Lo Vasco et al. ......... 228/180.2 |
| 5,400,950 A | * | 3/1995 | Myers et al. .......... 228/180.22 |
| 5,923,090 A | * | 7/1999 | Fallon et al. ................ 257/777 |
| 6,175,157 B1 | * | 1/2001 | Morifuji ..................... 257/777 |

FOREIGN PATENT DOCUMENTS

| JP | 1-238148 | * | 9/1989 |
| JP | 6-310565 | * | 11/1994 |
| JP | 8-46313 | * | 2/1996 |

* cited by examiner

*Primary Examiner*—Jasmine J B Clark
(74) *Attorney, Agent, or Firm*—Arent Fox Kintner Plotkin & Kahn, PLLC

(57) ABSTRACT

A semiconductor chip is bonded to the surface of another semiconductor chip with a predetermined gap secured in between. The semiconductor chip has a plurality of bumps formed on the surface thereof facing the other semiconductor chip. The bumps include functional bumps that contribute to electrical connection between the chips and dummy bumps that do not contribute thereto.

9 Claims, 4 Drawing Sheets

SEMICONDUCTOR CHIP AND SEMICONDUCTOR DEVICE HAVING A CHIP-ON-CHIP STRUCTURE

BACKGROUND OF THE INVENTION

1. Field of the Invention

The present invention relates to a semiconductor chip as is used to achieve a chip-on-chip structure by superposing one semiconductor chip on another semiconductor chip and bonding it thereto, or to achieve a flip-chip-bonding structure by bonding a semiconductor chip to a printed circuit board with the surface of the former facing the latter. The present invention relates also to a semiconductor device having a chip-on-chip structure.

2. Description of the Prior Art

One example of the structure of a semiconductor device that is devised to achieve further miniaturization and higher integration density is a so-called chip-on-chip structure in which a plurality of semiconductor chips are superposed on and bonded to one another with the surface of one semiconductor chip facing the surface of another.

In this chip-on-chip structure, as shown in FIG. 8, two semiconductor chips 91 and 92 that are so arranged as to face each other are coupled together, with a predetermined gap secured between them, and simultaneously electrically connected together by a plurality of bumps 93 provided between them. The semiconductor chips 91 and 92 thus superposed on each other are then resin-sealed, for example, in molded resin 94.

When sealed in the molded resin 94, the semiconductor chips 91 and 92 receive considerably high pressure from the molded resin 94. Moreover, if the semiconductor chips 91 and 92 have different thermal expansion coefficients, they develop strain due to stress when subjected to a large amount of heat during resin sealing. As a result, the semiconductor chips 91 and 92 are deformed in those portions thereof which are not supported by the bumps 93, and this degrades the characteristics of the devices formed on the semiconductor chips 91 and 92.

This problem is not unique to semiconductor devices having a chip-on-chip structure, but is common to semiconductor devices having a so-called flip-chip-bonding structure in which a semiconductor chip is bonded to a printed circuit board with the surface of the former facing the surface of the latter.

SUMMARY OF THE INVENTION

An object of the present invention is to provide a semiconductor chip and a semiconductor device having a chip-on-chip structure that are free from deformation resulting from mechanical pressure or stress.

To achieve the above object, according to one aspect of the present invention, a semiconductor chip designed to be bonded to the surface of a solid body with a predetermined gap secured in between has a plurality of bumps, for supporting the semiconductor chip, formed on the surface thereof that faces the surface of the solid body. Here, the bumps include functional bumps that contribute to electrical connection between the semiconductor chip and the solid body and dummy bumps that do not contribute thereto.

In this structure, on that surface of the semiconductor chip that faces the surface (substantially flat) of the solid body such as another semiconductor chip or a printed circuit board, there are formed not only functional bumps that contribute to electrical connection between the semiconductor chip and the solid body but also dummy bumps that do not contribute thereto. Thus, it is possible to distribute evenly the force that acts on the semiconductor chip when, for example, it is bonded to the solid body and then resin-sealed together therewith. This helps prevent deformation of the semiconductor chip resulting from mechanical pressure, strain due to stress, and the like and thereby permit the devices formed thereon to offer stable characteristics.

According to another aspect of the present invention, a semiconductor device having a chip-on-chip structure is provided with a first semiconductor chip and a second semiconductor chip that is superposed on and bonded to the surface of the first semiconductor chip and that has bumps formed on the surface thereof that faces the first semiconductor chip. Here, between the first semiconductor chip and the bumps formed on the second semiconductor chip are provided cushion pads that are so formed as to be thinner than the bumps formed on the second semiconductor chip.

In this structure, it is possible to absorb, by means of the cushion pads, the force that acts on the bumps when, for example, the first and second semiconductor chips are resin-sealed. Moreover, since the cushion pads are so formed as to be thinner than the bumps, it is possible to reduce the gap between the first and second semiconductor chips as compared with cases where bumps are bonded to bumps. This helps reduce the thickness of the semiconductor device. Furthermore, since the cushion pads are so formed as to be lower than the bumps, it is possible to reduce the material cost as compared with cases where bumps are formed instead.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
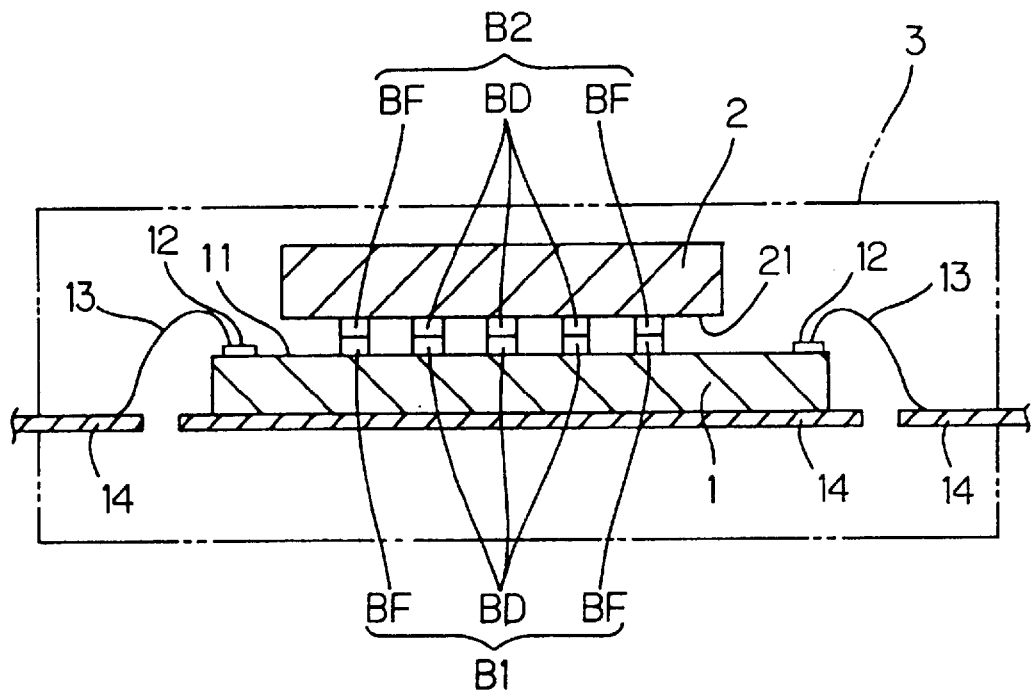
FIG. 1 is a schematic sectional view showing the outline of the structure of the semiconductor device of a first embodiment of the invention.

Hereinafter, embodiments of the present invention will be described with reference to the accompanying drawings.
First Embodiment First, with reference to FIGS. 1 to 6, a semiconductor chip and a semiconductor device having a chip-on-chip structure of a first embodiment of the invention will be described. FIG. 1 is a schematic sectional view showing the outline of the structure of the semiconductor device of the first embodiment of the invention. This semiconductor device has a so-called chip-on-chip structure, and is composed of a mother chip 1, a daughter chip 2 superposed on and bonded to the surface 11 of the mother chip 1, and a package 3 formed by sealing the mother and daughter chips 1 and 2 thus bonded together in resin so as to enclose them.

The mother chip 1 is formed out of, for example, a silicon chip. The surface 11 of the mother chip 1, i.e. that side of the semiconductor substrate constituting the base of the mother chip 1 on which an active surface-layer region lies in which functional devices such as transistors are formed, is covered with a surface protection film made of, for example, silicon nitride as the topmost layer. Above this protection film, a plurality of pads 12 for external connection are arranged so as to be exposed in predetermined positions near the edge of the substantially rectangular and flat surface 11 of the mother chip 1. These external connection pads 12 are to be connected to lead frames 14 by way of bonding wires 13.

The daughter chip 2 is formed out of, for example, a silicon chip. The surface 21 of the daughter chip 2, i.e. that side of the semiconductor substrate constituting the base of the daughter chip 2 on which an active surface-layer region lies in which functional devices such as transistors are formed, is covered with a surface protection film made of, for example, silicon nitride as the topmost layer. The daughter chip 2 is bonded to the mother chip 1 with the surface 21 of the former facing the surface 11 of the latter, i.e. by a so-called face-down method, and is supported by a plurality of bumps formed between the mother and daughter chips 1 and 2. Specifically, the daughter chip 2 has a plurality of daughter-chip bumps B2 formed on the surface 21 thereof so as to project therefrom, and the mother chip 1 has a plurality of mother-chip bumps B1 formed on the surface 11 thereof so as to project therefrom in positions corresponding to the daughter-chip bumps B2. Thus, by connecting the daughter-chip bumps B2 to the corresponding mother-chip bumps B1, the daughter chip 2 is supported above the mother chip 1.

The daughter-chip bumps B2 include functional bumps BF that are connected to the conductors laid inside the daughter chip 2 and dummy bumps BD that are insulated from the conductors laid inside the daughter chip 2. Similarly, the mother-chip bumps B1 include functional bumps BF that are connected to the conductors laid inside the daughter chip 2 and dummy bumps BD that are insulated from the conductors laid inside the daughter chip 2. The functional bumps BF of the mother chip 1 and the functional bumps BF of the daughter chip 2 are so arranged as to face each other, and by connecting these functional bumps BF together, the conductors laid inside the mother chip 1 and the conductors laid inside the daughter chip 2 are electrically connected together. By contrast, although the dummy bumps BD of the mother chip 1 and the dummy bumps BD of the daughter chip are also so arranged as to face each other, connecting these dummy bumps BD together does not contribute to electrical connection between the mother and daughter chips 1 and 2.

Figure 2:
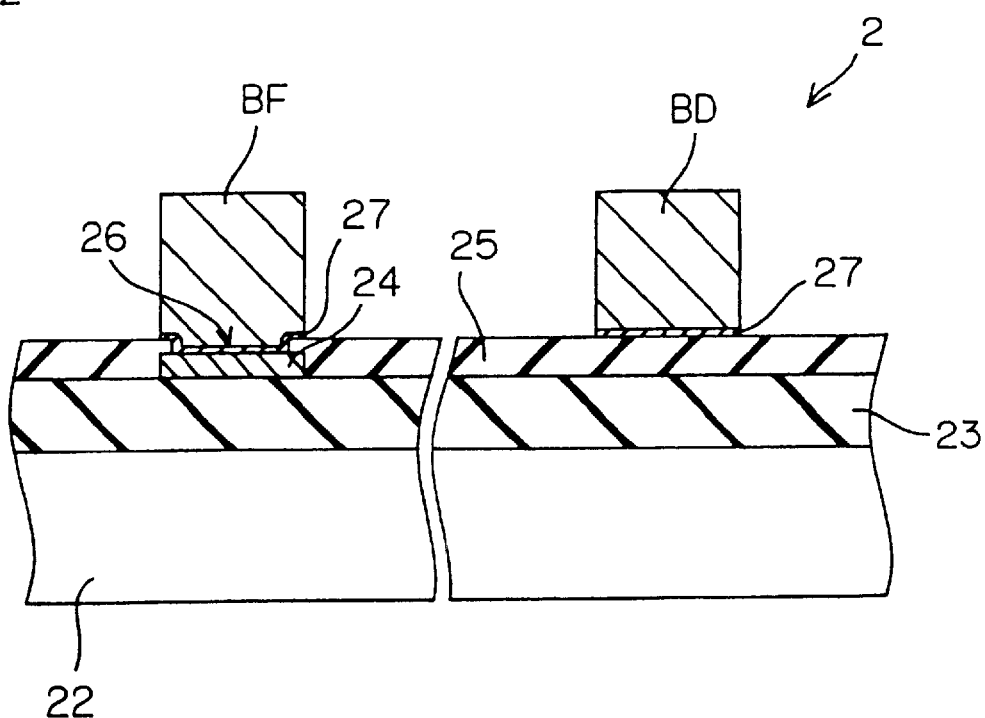
FIG. 2 is an enlarged sectional view showing the structure of the daughter chip shown in FIG. 1.

FIG. 2 is an enlarged sectional view showing the structure of the daughter chip 2. On the substrate 22 of the daughter chip 2, a field oxide film 23 made of, for example, silicon oxide is formed, and on this field oxide film 23, a conductor 24 is laid. The surfaces of the field oxide film 23 and of the conductor 24 are covered with a surface protection film 25, and, in an opening 26 formed in this surface protection film 25, a functional bump BF made of an oxidation-resistant metal (such as gold, lead, platinum, silver, or iridium) is formed. On the other hand, a dummy bump BD is formed on the surface protection film 25 using the same material as the functional bump BF.

The functional bump BF and the dummy bump BD can be formed in the same process. Specifically, first, for the functional bump BF, an opening 26 is formed in the surface protection film 25 so as to expose the conductor 24, and then a seed film 27 is formed all over the surface of the surface protection film 25 including the portion thereof in which the opening 26 is formed. Then, a resist film is formed all over the seed film 27 except the portion thereof that lies right above the opening 26 and the portion thereof where the dummy bump BD will be formed. Then, the whole surface is plated with the material of the functional and dummy bumps BF and BD. Thereafter, the resist film formed over the seed film 27 is removed, and then those portions of the seed film 27 which are exposed as a result of the resist film being removed are removed. In this way, the functional and dummy bumps BF and BD are formed.

Incidentally, for example when the functional and dummy bumps BF and BD are made of Au (gold), the seed film 27 mentioned above can be formed by forming a film of TiW (titanium tungsten) over the surface protection film 25 by sputtering and then laying a film of Au over this film of TiW by sputtering. Alternatively, when the functional and dummy bumps BF and BD are made of Au (gold), the seed film 27 may be formed by forming a film of titanium over the surface protection film 25 by sputtering and then laying a film of Au over this film of titanium by sputtering.

Although the functional and dummy bumps BF and BD are described above as being made of the same material, they may be made of different materials. In that case, the dummy bump BD and the functional bump BF are formed in separate processes. Specifically, after the functional bump BF has been formed, the dummy bump BD can be formed, for example, by laying a film of titanium over the surface protection film 25, and then coating this film of titanium selectively with titanium plating.

Figure 3:
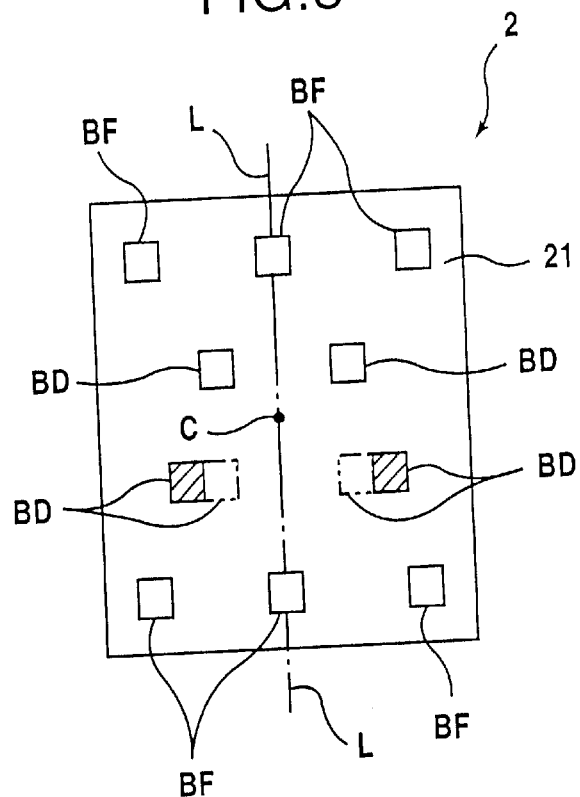
FIG. 3 is a plan view showing an example of how the functional and dummy bumps are arranged on the surface of the daughter chip.

FIG. 3 is a plan view showing an example of how the functional and dummy bumps are arranged on the surface of the daughter chip. In this arrangement, a plurality of (specifically, six) functional bumps BF are arranged in a peripheral portion of the surface 21, along two opposite sides thereof. On the other hand, a plurality of (specifically, four) dummy bumps BD (central dummy bumps) are arranged in a central portion of the surface 21. Thus, the peripheral portion of the daughter chip 2 is supported by the functional bumps BF, and the central portion of the daughter chip 2 is supported by the dummy bumps BD. This helps prevent deformation such as strain due to stress from developing in the mother or daughter chip 1 or 2 when the semiconductor device formed by bonding them together is sealed in resin.

Moreover, in this arrangement, the functional bumps BF are so arranged as to be symmetric with respect to a line L passing through the center C of the surface 21, and so are the dummy bumps BD. Thus, the whole of the daughter-chip bumps B2 (specifically, ten in all) are so arranged as to be symmetric with respect to the line L passing through the center C. This helps more effectively prevent deformation such as strain due to stress from developing in the mother or daughter chip 1 or 2.

It is to be noted that, if the positions of the two dummy bumps BD indicated by hatching in FIG. 3 are moved to the positions indicated by dash-dot-dot lines, the functional bumps BF are so arranged as to be symmetric with respect to the center C of the surface 21, and so are the dummy bumps BD. This arrangement, too, helps more effectively prevent deformation such as strain due to stress from developing in the mother or daughter chip 1 or 2.

Figure 4:
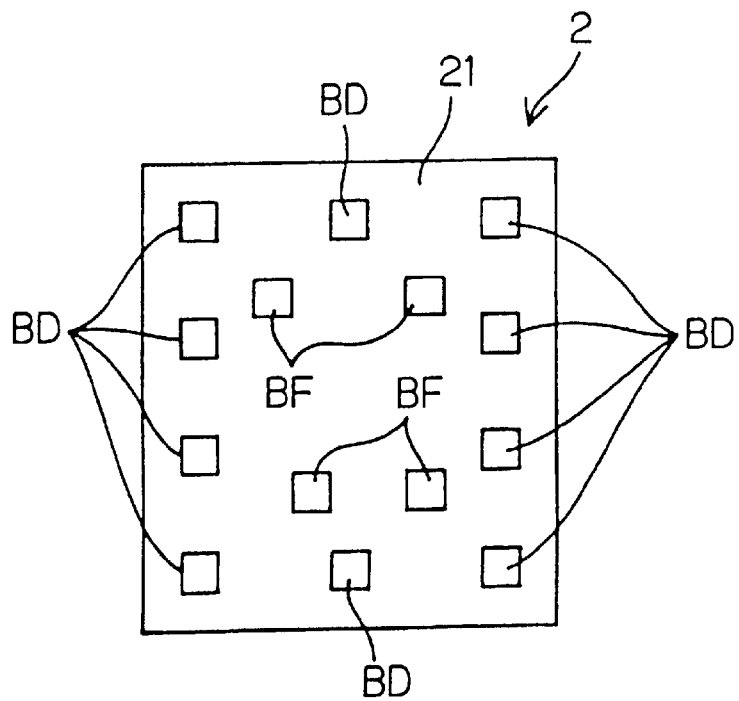
FIG. 4 is a plan view showing another example of how the functional and dummy bumps are arranged on the surface of the daughter chip.

FIG. 4 is a plan view showing another example of how the functional and dummy bumps are arranged on the surface of the daughter chip. In this arrangement, a plurality of (specifically, four) functional bumps BF are arranged in a central portion of the surface 21. On the other hand, a plurality of (specifically, ten) dummy bumps BD (peripheral dummy bumps) are arranged in a peripheral portion of the surface 21. Thus, the peripheral portion of the daughter chip 2 is supported by the dummy bumps BD, and the central portion of the daughter chip 2 is supported by the functional bumps BF. This helps prevent deformation such as strain due to stress from developing in the mother or daughter chip 1 or 2 when the semiconductor device formed by bonding them together is sealed in resin.

Figure 5:
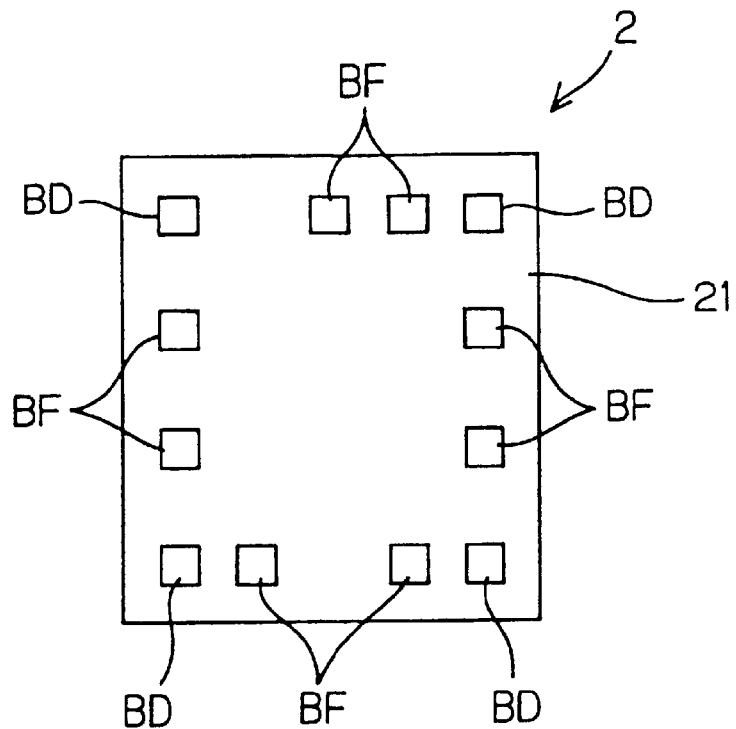
FIG. 5 is a plan view showing still another example of how the functional and dummy bumps are arranged on the surface of the daughter chip.

FIG. 5 is a plan view showing still another example of how the functional and dummy bumps are arranged on the surface of the daughter chip. In this arrangement, a plurality of (specifically, eight) functional bumps BF are arranged in a peripheral portion of the surface 21, and four dummy bumps BD (corner dummy bumps) are arranged in corner portions of the surface 21.

In this arrangement, the dummy bumps BD are arranged in all of the corner portions of the surface 21. Thus, even if a high pressure is applied to the corner portions of the daughter chip 2 when the semiconductor device formed by bonding the mother and daughter chips 1 and 2 together is sealed in resin, the pressure is borne by the dummy bumps BD. This helps prevent damage, such as chipping, to be caused to the corner portions of the daughter chip 2.

Figure 6:
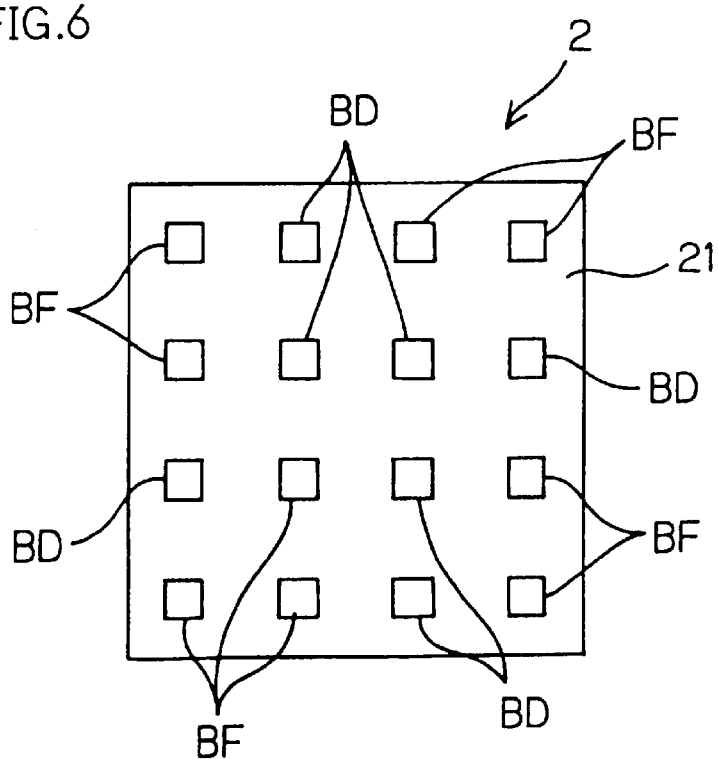
FIG. 6 is a plan view showing still another example of how the functional and dummy bumps are arranged on the surface of the daughter chip.

FIG. 6 is a plan view showing still another example of how the functional and dummy bumps are arranged on the surface of the daughter chip. In this arrangement, after the arrangement of a plurality of (specifically, nine) functional bumps BF has been determined, the arrangement of a plurality of (specifically, seven) dummy bumps BD is determined in such a way that the whole of the daughter-chip bumps B2 are so arranged as to be distributed evenly over the surface 21.

In this arrangement, the force acting on the mother and daughter chips 1 and 2 when the semiconductor device formed by bonding them together is sealed in resin can be distributed substantially evenly among the bumps B1 and B2 provided between the mother and daughter chips 1 and 2. This helps effectively prevent deformation of the mother or daughter chip 1 or 2 resulting form mechanical pressure, strain due to stress, and the like.

As described above, according to this embodiment, it is possible to realize a semiconductor device that is satisfactorily resistant to mechanical pressure and stress as are inevitable during resin sealing. Moreover, by appropriately arranging the bumps B1 and B2 that are provided between the mother and daughter chips 1 and 2, it is possible to more effectively prevent deformation resulting from mechanical pressure and stress.

In this embodiment, the mother chip 1 is provided with mother-chip bumps B1 and the daughter chip 2 is provided with daughter-chip bumps B2; however, it is also possible to provide bumps either on the mother chip 1 or on the daughter chip 2 and achieve chip-on-chip bonding by connecting those bumps to the surface of the other chip.

Second Embodiment

Figure 7:
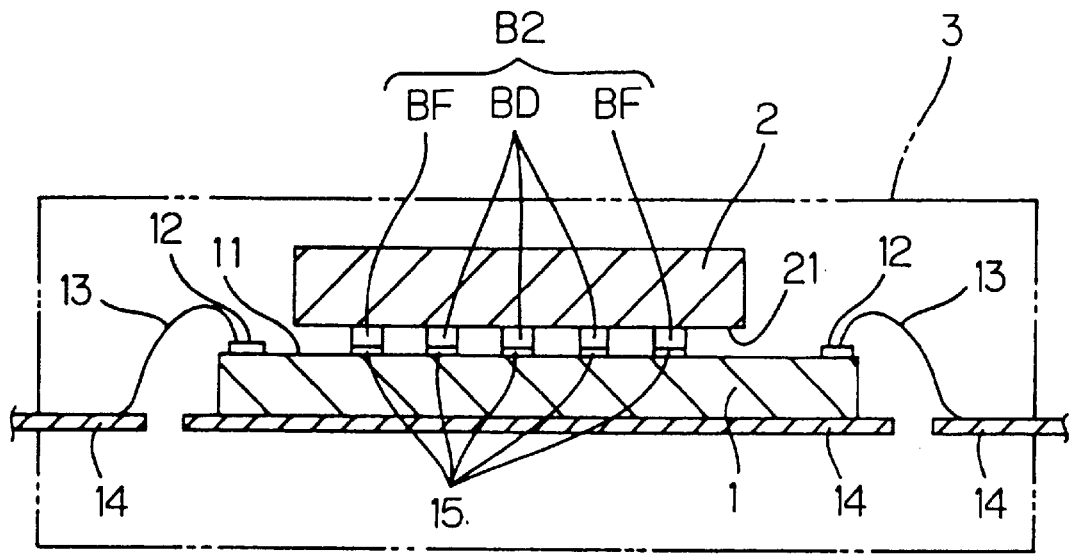
FIG. 7 is a schematic sectional view showing the outline of the structure of the semiconductor device of a second embodiment of the invention.
Figure 8:
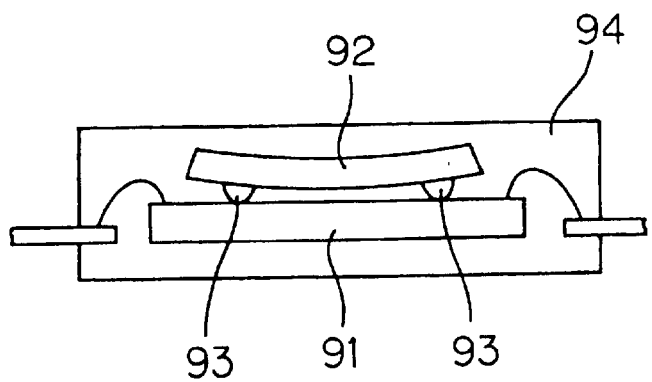
FIG. 8 is a schematic sectional view showing a conventional chip-on-chip structure.

Next, with reference to FIG. 7, a semiconductor chip and a semiconductor device having a chip-on-chip structure of a second embodiment of the invention will be described. FIG. 7 is a schematic sectional view showing the outline of the structure of the semiconductor device of the second embodiment of the invention.

In FIG. 7, such elements as are found also in FIG. 1 described previously are identified with the same reference numerals and symbols, and their detailed descriptions will be omitted. In the semiconductor device shown in FIG. 7, on the surface 21 of the daughter chip 2, a plurality of daughter-chip bumps B2 are formed so as to project therefrom, and, on the surface 11 of the mother chip 1, a plurality of cushions 15 are formed individually in positions corresponding to the daughter-chip bumps B2. Thus, by connecting the daughter-chip bumps B2 to the corresponding cushions 15, the daughter chip 2 is supported above the mother chip 1.

Those of the cushions 15 that face functional bumps BF are connected to the conductors laid inside the mother chip 1, and thus connecting these cushions 15 to the functional bumps BF achieves electrical connection between the conductors laid inside the mother chip 1 and the conductors laid inside the daughter chip 2. On the other hand, those of the cushions 15 that face dummy bumps BD are insulated from the conductors laid inside the mother chip 1, and thus connecting these cushions 15 to the dummy bumps BD does not contribute to electrical connection between the mother and daughter chips 1 and 2.

The cushions 15 are made of a metal, such as copper, solder, or gold, that can be bonded well to the daughter-chip bumps B2 by thermo-compression bonding. For example, the cushions 15 are formed by forming openings in the surface protection film of the mother chip 1, then forming a seed film over this surface protection film including the portion thereof in which the openings are formed, and then coating this seed film partially with plating. The cushions 15 are so formed as to be thinner than the daughter-chip bumps B2; for example, the cushions 15 have approximately one tenth of the thickness (height) of the daughter-chip bumps B2.

According to this embodiment, it is possible to absorb, by means of the cushions 15, the force that acts on the daughter-chip bumps B2 when the semiconductor device formed by bonding the mother and daughter chips 1 and 2 together is sealed in resin.

Moreover, since the cushions 15 are so formed as to be thinner than the daughter-chip bumps B2, it is possible to reduce the gap between the mother and daughter chips 1 and 2 as compared with cases where bumps having approximately the same height as the daughter-chip bumps B2 are formed also on the mother chip 1 and those bumps are connected to the daughter-chip bumps B2. This helps reduce the thickness of the semiconductor device as a whole. Moreover, it is possible to reduce the material cost as compared with cases where bumps are formed instead of the cushions 15. By forming the cushions 15 out of copper or solder, it is possible to reduce the material cost further.

In this embodiment, the cushions 15 are formed by coating the seed film partially with plating. However, for example in cases where the seed film has an appropriate thickness so as to have sufficient mechanical strength to endure being bonded to the daughter-chip bumps B2 by thermo-compression bonding, it is also possible to form the cushions 15 by, instead of partial plating, selective removal of the seed film. This helps reduce the number of steps required in manufacturing the semiconductor device.

It is to be noted that, in this embodiment, the functional and dummy bumps BF and BD provided on the surface of the daughter chip 2 may be arranged in arrangements like those shown in FIGS. 3 to 6 described previously in connection with the first embodiment. This helps more effectively prevent deformation of the mother or daughter chip 1 or 2 resulting from mechanical pressure, strain due to stress, and the like when the semiconductor device formed by bonding them together is sealed in resin.

The present invention can be carried out in any other way than it is carried out in the embodiments described above. For example, although the above-described embodiments deal with cases in which both the mother chip 1 and the daughter chip 2 are made of silicon, it is possible to use semiconductor chips made of any other material than silicon, such as gallium-arsenide or germanium. The mother and daughter chips 1 and 2 may be made of either identical or different materials.

Moreover, although the above-described embodiments deal with semiconductor devices having a chip-on-chip structure, the present invention is applicable also to semiconductor devices having a flip-chip-bonding structure in which a semiconductor chip is bonded to a printed circuit board with the surface of the former facing the latter.

Obviously, many modifications and variations of the present invention are possible in light of the above teachings. It is therefore to be understood that within the scope of the appended claims, the invention may be practiced other than as specifically described.

What is claimed is:

1. A semiconductor chip designed to be bonded to a surface of a solid body with a predetermined gap secured in between, the semiconductor chip having a plurality of bumps formed on a surface thereof that faces the surface of the solid body, the bumps serving to support the semiconductor chip, wherein the bumps include functional bumps that are configured to contribute to electrical connection between the semiconductor chip and the solid body and, dummy bumps that, although having a substantially identical structure as the functional bumps, do not contribute to the electrical connection, and wherein the semiconductor chip is bonded to the solid body by pressure.

2. A semiconductor chip as claimed in claim 1, wherein the dummy bumps include central dummy bumps that are formed in a central portion of the surface of the semiconductor chip that faces the surface of the solid body.

3. A semiconductor chip as claimed in claim 1, wherein the dummy bumps include peripheral dummy bumps that are formed in a peripheral portion of the surface of the semiconductor chip that faces the surface of the solid body.

4. A semiconductor chip as claimed in claim 1, wherein the dummy bumps include corner dummy bumps that are formed in corner portions of the surface of the semiconductor chip that faces the surface of the solid body.

5. A semiconductor chip as claimed in claim 1, wherein the bumps are so arranged as to be substantially symmetric with respect to a center of the surface of the semiconductor chip that faces the surface of the solid body.

6. A semiconductor chip as claimed in claim 1, wherein the bumps are so arranged as to be substantially symmetric with respect to a line passing through a center of the surface of the semiconductor chip that faces the surface of the solid body.

7. A semiconductor chip as claimed in claim 1, wherein the bumps are so arranged as to be distributed substantially evenly over the surface of the semiconductor chip that faces the surface of the solid body.

8. A semiconductor device having a chip-on-chip structure, comprising:

a first semiconductor chip; and a second semiconductor chip superposed on and bonded to a surface of the first semiconductor chip, the second semiconductor chip having bumps formed on a surface thereof that faces the first semiconductor chip, wherein the bumps include functional bumps that are configured to contribute to electrical connection between the first and the second semiconductor chips and dummy bumps that, although having a substantially identical structure as the functional bumps, do not contribute to the electrical connection, and wherein the first and second semiconductor chips are bonded together by pressure; and between the first semiconductor chip and the bumps formed on the second semiconductor chip, cushion pads are provided that are so formed as to be thinner than the bumps formed on the second semiconductor chip.

9. A semiconductor chip as claimed in claim 1, wherein the functional bumps are formed, using an oxidation-resistant metal, on a seed film in an opening formed in a surface protection film of the semiconductor chip, and the dummy bumps are formed, using a same material as the functional bumps, on a seed film laid on the surface protection film of the semiconductor chip.

* * * * *